United States Patent [19]
Liu et al.

[11] Patent Number: 6,009,203
[45] Date of Patent: Dec. 28, 1999

[54] METHOD AND APPARATUS FOR HYBRID VLC BITSTREAM DECODING

[75] Inventors: Yi Liu; Michael Tucker; Geoffrey Strongin, all of Austin, Tex.

[73] Assignee: Advanced Micro Devices, Inc., Sunnyvale, Calif.

[21] Appl. No.: 08/911,212

[22] Filed: Aug. 14, 1997

Related U.S. Application Data

[63] Continuation of application No. 08/424,738, Apr. 18, 1995, abandoned.

[51] Int. Cl.$^6$ ........................................................ G06K 9/36
[52] U.S. Cl. ............................................ 382/233; 382/246
[58] Field of Search ................................... 382/233, 246, 382/239, 245; 341/65, 67; 358/261.1, 261.2, 427

[56] References Cited

U.S. PATENT DOCUMENTS

| | | | |
|---|---|---|---|
| 3,918,047 | 11/1975 | Denes | 340/347 DD |
| 5,144,424 | 9/1992 | Savatier | 358/133 |
| 5,253,053 | 10/1993 | Chu et al. | 382/233 |
| 5,357,282 | 10/1994 | Lee | 348/403 |
| 5,386,232 | 1/1995 | Golin et al. | 348/391 |
| 5,400,075 | 3/1995 | Savatier | 348/384 |
| 5,481,364 | 1/1996 | Ito | 382/233 |
| 5,488,616 | 1/1996 | Takishima et al. | 371/30 |
| 5,489,944 | 2/1996 | Jo | 348/405 |
| 5,502,493 | 3/1996 | Meyer | 348/426 |
| 5,510,840 | 4/1996 | Yonemitsu et al. | 348/402 |
| 5,523,847 | 6/1996 | Feig et al. | 358/261.3 |
| 5,552,832 | 9/1996 | Astle | 382/245 |
| 5,559,557 | 9/1996 | Kato | 348/405 |
| 5,793,896 | 8/1998 | Golin | 382/239 |
| 5,802,213 | 9/1998 | Gardos | 382/239 |

FOREIGN PATENT DOCUMENTS

| | | | |
|---|---|---|---|
| 0 283 735 | 9/1988 | European Pat. Off. | H03M 7/30 |
| 0 493 086 | 7/1992 | European Pat. Off. | H03M 7/36 |
| 2 267 410 | 12/1993 | United Kingdom | H04N 7/137 |

OTHER PUBLICATIONS

Dr. Richard Baker, "Standards Dominate Videoconferencing Implementations", *Computer Design*, Dec. 1994, pp. 66–70.

Stephen Ohr, "Digital Video Spearheads TV and Videoconferencing Applications", *Computer Design*, Dec. 1994, pp. 59–64.

Lawrence A. Rowe, et al., "MPEG Video in Software: Representation, Transmission, and Playback," High Speed Networking and Multimedia Computing, *Symp. on Elec. Imaging Sci. & Tech.*, San Jose, CA, Feb., 1994, pp. 1–11.

Peng H. Ang, et al., "Video Compression Makes Big Gains", *IEEE Spectrum*, Oct. 1991, pp. 16–19.

(List continued on next page.)

*Primary Examiner*—Andrew W. Johns
*Attorney, Agent, or Firm*—Skjerven, Morrill, MacPherson, Franklin, & Friel, L.L.P.; Ken J. Koestner

[57] ABSTRACT

A method and apparatus for decoding variable length code (VLC) data employ a hybrid technique of parsing short-length VLC codes using a binary tree or binary search procedure and parsing longer VLC codes using a table lookup procedure. This technique includes the steps of accessing a plurality of bits of coded bitstream data, bit testing a preselected number N first bits of the plurality of bitstream bits and determining whether the N first bits include a complete VLC code. If the N first bits include a complete VLC code, a VLC code is decoded in accordance with a result of the bit testing step. If the N first bits do not include a complete VLC code, a VLC code is decoded from a lookup table to a table element addressed by the bits of coded bitstream data.

22 Claims, 8 Drawing Sheets

OTHER PUBLICATIONS

Andy C. Hung, et al, "A Comparison of Fast Inverse Discrete Cosine Transform Algorithms", *Multimedia Systems*, ©1994, pp. 204–217.

P1180/D1, "Draft Standard Specification for the Implementations of 8×8 Inverse Discrete Cosine Transform", May 29, 1990, pp. 1–9.

ISO/IEC 11172-1, Information Technology–Coding of Moving Pictures and Associated Audio for Digital Storage Media at up to about 1,5 Mbit/s—Part 1: Systems, Aug. 1, 1993, pp. i–vi, 1–53.

ISO/IEC 11172-2, Information Technology–Coding of Moving Pictures and Associated Audio for Digital Storage Media at up to about 1,5 Mbit/s—Part 1: Video, Aug. 1, 1993, pp. i–ix, 1–112.

ISO/IEC 11172-3, Information Technology–Coding of Moving Pictures and Associated Audio for Digital Storage Media at up to about 1,5 Mbit/s—Part 1: Audio, Aug. 1, 1993, pp. i–vi, 1–150.

Kevin L. Gong, et al., "Parallel MPEG-1 Video Encoding", Report, University of California, Berkeley, Computer Science Division, 1994, pp. 1–14.

METHOD AND APPARATUS FOR HYBRID VLC BITSTREAM DECODING

RELATED PATENT APPLICATIONS

This application is a continuation of application Ser. No. 08/424,738, filed Apr. 18, 1995 now abandoned.

The present invention is related to subject matter which is disclosed in:

U.S. patent application Ser. No. 08/423,913 filed on the same day as the present patent application (Geoffrey S. Strongin, Yi Liu and Michael R. Tucker, "Method and Apparatus for Improved Video Decompression by Selection of IDCT Method Based on Image Characteristics"), U.S. patent application Ser. No. 08/423,918 filed on the same day as the present patent application (Michael R. Tucker, Geoffrey S. Strongin and Yi Liu, "Method and Apparatus for Improved Video Decompression by Prescaling of Pixel and Error Terms Prior to Merging"), U.S. patent application Ser. No. 08/423,912 filed on the same day as the present patent application now U.S. Pat. No. 5,864,637 (Yi Liu, Michael R. Tucker and Geoffrey S. Strongin, "Method and Apparatus for Improved Video Decompression by Selective Reduction of Spatial Resolution"), and U.S. patent application Ser. No. 08/424,736 filed on the same day as the present patent application now U.S. Pat. No. 5,784,494 (Geoffrey S. Strongin, Yi Liu and Michael R. Tucker, "Method and Apparatus for Prestoring Dequantization Information for DCT VLC Decoding").

The present invention is related to subject matter which is disclosed in:

U.S. patent application Ser. No. 08/443,206 filed on the same day as the present patent application and now U.S. Pat. No. 5,680,482 (Yi Liu, Michael R. Tucker, and Geoffrey S. Strongin, "Method and Apparatus for Improved Video Decompression by Adaptive Selection of Video Input Parameters").

U.S. patent application Ser. No. 08/423,914 filed on the same day as the present patent application and now U.S. Pat. No. 5,872,866, (Geoffrey S. Strongin, Yi Liu, and Michael R. Tucker, "Method and Apparatus for Improved Video Decompression by Predetermination of IDCT Results Based on Image Characteristics").

Each of the identified patent applications is incorporated herein by reference in its entirety.

FIELD OF INVENTION

The present invention relates to decompression of video information and, more particularly, to efficient parsing of variable length coded video information in a decompression process.

BACKGROUND OF THE INVENTION

Video information requires a large amount of storage space, therefore video information is generally compressed before it is stored. Accordingly, to display compressed video information which is stored, for example, on a compact disk read only memory (CD ROM), the compressed video information must be decompressed to provide decompressed video information. The decompressed video information is then provided in a bit stream to a display. The bit stream of video information is generally stored in a plurality of memory storage locations corresponding to pixel locations on a display, the stored video information is generally referred to as a bit map. The video information required to present a single screen of information on a display is called a picture. A goal of many video systems is to quickly and efficiently decode compressed video information so as to provide motion video.

Standardization of recording media, devices and various aspects of data handling, such as video compression, is highly desirable for continued growth of this technology and its applications. One compression standard which has attained wide spread use for compressing and decompressing video information is the moving pictures expert group (MPEG) standard for video encoding and decoding. The MPEG standard is defined in International Standard ISO/IEC 11172-1, "Information Technology—Coding of moving pictures and associated audio for digital storage media at up to about 1.5 Mbit/s", Parts 1, 2 and 3, First edition Aug. 1, 1993 which is hereby incorporated by reference in its entirety. Other standards include a Joint Photographics Experts Group standard (JPEG) and a Consulting Committee for International Telegraphy and Telephony standard (CCITTH.261).

Pictures within the MPEG standard are divided into 16×16 pixel macroblocks. Each macroblock includes six 8×8 blocks: four luminance (Y) blocks, one chrominance red (Cr) block and one chrominance blue (Cb) block. The luminance blocks correspond to sets of 8×8 pixels on a display and control the brightness of respective pixels. The chrominance blocks to a large extent control the colors for sets of four pixels. For each set of four pixels on the display, there is a single Cr characteristic and a single Cb characteristic.

For example, referring to FIG. 1, labeled prior art, a picture presented by a typical display includes 240 lines of video information in which each line has 352 pixels. Accordingly, a picture includes 240×352=84,480 pixel locations. Under the MPEG standard, this picture of video includes 44 by 30 luminance blocks or 1320 blocks of luminance video information. Additionally, because each macroblock of information also includes two corresponding chrominance blocks, each picture of video information also includes 330 Cr blocks and 330 Cb blocks. Accordingly, each picture of video information requires 126,720 pixels or 1,013,760 bits of bit mapped storage space for presentation on a display.

There are three types of pictures of video information which are defined by the MPEG standard, intra-pictures (I picture), forward predicted pictures (P picture) and bi-predicted pictures (B picture).

An I picture is encoded as a single image having no reference to any past or future picture. Each block of an I picture is encoded independently. Accordingly, when decoding an I picture, no motion processing is necessary. However, for the reasons discussed below, it is necessary to store and access I pictures for use in decoding other types of pictures.

A P picture is encoded relative to a past reference picture. A reference picture is a P or I picture. The past reference picture is the closest preceding reference picture. Each macroblock in a P picture can be encoded either as an I macroblock or as a P macroblock. A P macroblock is stored within a 16×16 area of a past reference picture plus an error term. To specify the location of the P macroblock, a motion vector (i.e., an indication of the relative position of the picture with reference to the past reference picture) is also encoded. When decoding a P picture, the current P macroblock is created with the 16×16 area from the reference picture. The macroblock from the reference picture is offset according to motion vectors. The decoding function accordingly includes motion compensation, which is performed on a macroblock, in combination with error (IDCT) terms, which are defined on a block by block basis.

A B picture is encoded relative to the past reference picture and a future reference picture. The future reference picture is the closest proceeding reference picture. Accordingly, the decoding of a B picture is similar to that of a P picture with the exception that a B picture motion vector may refer to areas in the future of the reference picture. For macroblocks that use both past and future reference pictures, the two 16×16 areas are averaged. When decoding a B picture the current B macroblock is created with the 16×16 areas from the past and future reference pictures. The macroblocks from the reference pictures are offset according to motion vectors.

Pictures are coded using a discrete cosine transform (DCT) coding scheme which encodes coefficients as an amplitude of a specific cosine basis function. The DCT coefficients are further coded using variable length coding. Variable length coding (VLC) is a statistical coding technique that assigns codewords to values to be encoded. Values of high frequency of occurrence are assigned short codewords, and those of infrequent occurrence are assigned long codewords. On the average, the more frequent shorter codewords dominate so that the code string is shorter than the original data.

The ISO/IEC 11172-2 standard stipulates for intra-coded luminance and chrominance macroblocks that dct_recon [m][n], the matrix of reconstructed DCT coefficients of a block, shall be computed by any means equivalent to the following procedure:

```
for(m=0; m<8;m++) {
    for(n=0;n<8;n++) {
        i=scan[m][n];
        dct_recon[m][n]=(2*dct_zz[i]*
            quantizer_scale*intra_quant[m][n])/16;
        if((dct_recon[m][n] & 1)==0)
            dct_recon[m][n]=dct_recon[m][n]-
                Sign(dct_recon[m][n]);
        if(dct_recon[m][n]>2047) dct_recon[m][n] = 2047;
        if (dct-recon[m][n]<-2048)
            dct_recon[m][n]= -2048;
    }
}
dct_recon[0][0]=dct_zz[0]*8;
if((macroblock_address - past_intra_address>1))
    dct_recon[0][0]= (128 *8)+dct_recon[0][0];
else
    dct_recon[0][0]=dct_dc_X_past + dct_recon[0][0];
dct_dc_X_past=dct_recon[0][0];
```

In this procedure, m identifies the row and n identifies the column of the matrix. Scan[][] is a matrix defining a zigzag scanning sequence. Dct_zz[] is a zigzag-scanned quantized DCT coefficient list. Each dct_zz[] matrix is associated with a particular block. Quantizer_scale, which may be specified in a header for each macroblock, is a number used to calculate DCT coefficients from the transmitted quantized coefficients. Intra_quant[][] is a intracoded picture quantizer matrix that is specified in a sequence header. Past_intra_address as the macroblock_address of the most recently retrieved intra_coded macroblock within a slice. (Pictures are divided into slices. Each slice consists of an integral number of macroblocks in raster scan order.)

Similarly, the ISO/IEC 11172-2 standard stipulates for inter-coded macroblocks that dct_recon[m][n], the matrix of reconstructed DCT coefficients of a block, shall be computed by any means equivalent to the following procedure:

```
for(m=0;m<8;m++) {
    for(n=0; n<8; n++){
        i=scan[m][n];
        dct_recon[m][n]=(((2*dct_zz[i])+
            Sign(dct_zz{i}))*
        quantizer_scale*non_intra_quant[m][n])/16;
        if((dct_recon[m][n]& 1)==0)
            dct_recon[m][n]=dct_recon[m][n]-
                Sign(dct_recon[m][n]);
        if(dct_recon[m][n]>2047)
            dct_recon[m][n]=2047;
        if(dct_recon[m][n]<-2048)
            dct_recon[m][n]=-2048;
        if(dct_zz[i] == 0) dct_recon[m][n]=0;
    }
}
```

Non_intra_quant[][] is the non-intra quantizer matrix that is specified in the sequence header.

For a video system to provide a motion video capability, compressed video information must be quickly and efficiently decoded. One aspect of the decoding process is variable length code (VLC) decoding. A time-critical operation in VLC decoding is parsing of the VLC bitstream. Highly efficient parsing and decoding are critical for high performance motion video capability. A technique for providing such highly efficient parsing and decoding is necessary.

SUMMARY OF THE INVENTION

In accordance with one embodiment of the present invention, a method of decoding variable length code (VLC) data includes the steps of accessing a plurality of bits of coded bitstream data, bit testing a preselected number N first bits of the plurality of bitstream bits and determining whether the N first bits include a complete VLC code. If the N first bits include a complete VLC code, a VLC code is decoded in accordance with a result of the bit testing step. If the N first bits do not include a complete VLC code, a VLC code is decoded from a lookup table to a table element addressed by the bits of coded bitstream data.

Use of the hybrid method described herein has several advantages. One advantage is that the hybrid method efficiently decodes short VLC codes which occur frequently while avoiding a massive computational burden that an occasional lengthy VLC code would incur using the binary tree search method. A further advantage is that both table checking and binary searching are used to parse a VLC bitstream so that frequently occurring short codes are parsed much faster than is possible using exclusively a table lookup regimen.

DETAILED DESCRIPTION

Figure 2:
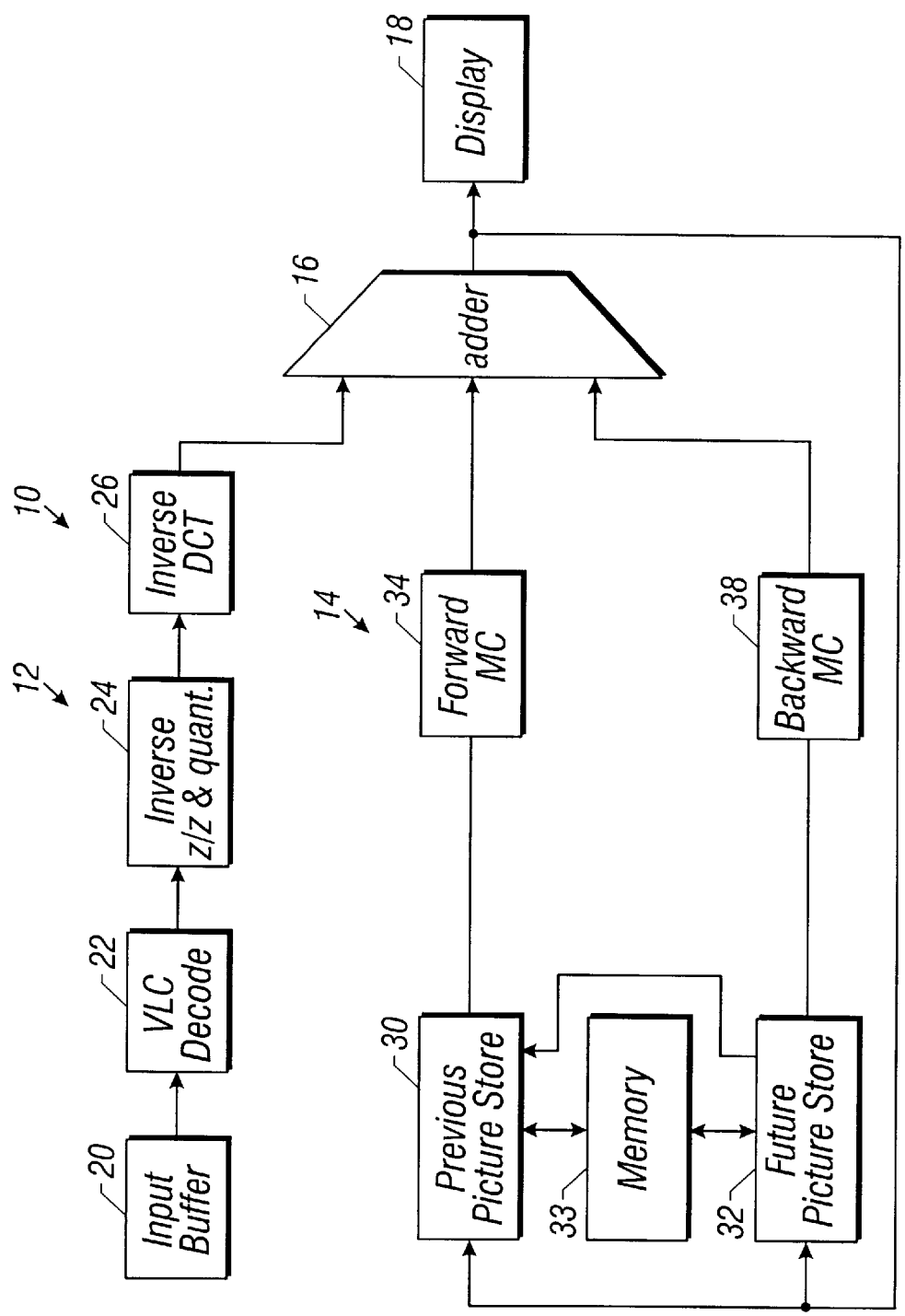
FIG. 2 shows a block diagram of a decoder video system in accordance with the present invention.

Referring to FIG. 2, a system for decompressing video information is shown. Video system 10 includes input stream decoding portion 12 incorporating an inverse discrete cosine transformation, motion decoding portion 14, adder 16 and display device 18. Input stream decoding portion 12 receives a stream of compressed video information and provides blocks of statically decompressed video information to adder 16. Motion decoding portion 14 receives motion information and provides motion compensation information to adder 16. Adder 16 receives the statically decompressed video information and the motion compensation information and provides decompressed video information to display 18.

Input stream decoding portion 12 includes input buffer 20, variable length coding (VLC) decoder 22, inverse zig-zag and quantizer circuit 24 and inverse discrete cosine transform circuit 26. Motion decoding portion 14 includes previous picture store circuit 30, and future picture store circuit 32, memory 33, forward motion compensation circuit 34 and backward motion compensation circuit 38. Display device 18 includes a picture buffer (not shown) which allows information provided by adder 16 to be rasterized prior to display by display device 18.

Input stream decoding portion 12 provides statically decompressed video signals to adder 16 on a block-by-block basis. Additionally, forward motion compensation circuit 34 and backward motion compensation circuit 38 of motion decoding portion 14 provide motion compensation signals to adder 16 on a macroblock by macroblock basis. Adder 16 provides a decompressed video signal to display 18 on a picture by picture basis. The decompressed video signal is also provided as a previous picture signal to previous picture store circuit 30 and future picture store circuit 32 (in the case of an I or P picture).

Figure 3:
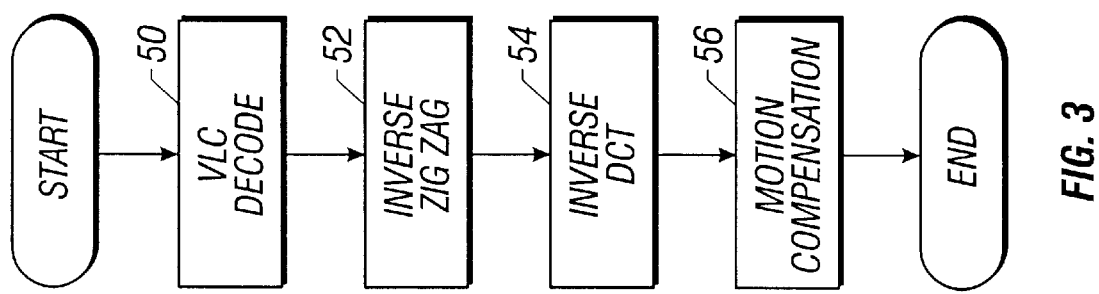
FIG. 3 shows a flow chart of the decoding of video information which is encoded using the MPEG standard.
Figure 1:
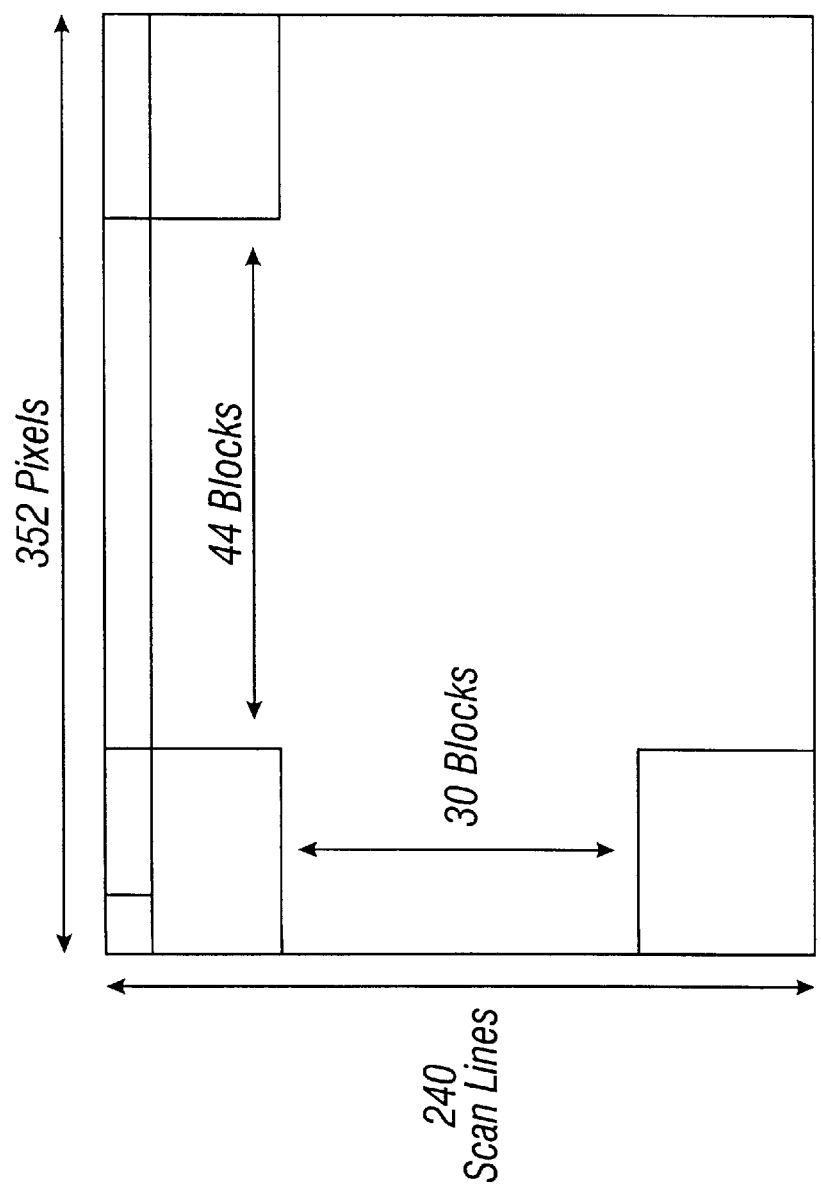
FIG. 1, labeled prior art, shows an arrangement of blocks of pixels on a display screen.

Referring to FIGS. 2 and 3, in operation, input buffer 20 receives a compressed video signal in the form of a bitstream from a video signal source such as a CD ROM (not shown); the compressed video signal is provided as a stream of compressed video information. Input buffer 20 buffers this compressed video signal to compensate for the speed which the signal is provided by the video source. The input bitstream is accumulated in the input buffer 20 until the bitstream data is to be utilized. This buffered compressed video signal is provided to VLC decoder 22 which decodes the variable length coded portion of the compressed signal at VLC decoding step 50 to provided a variable length decoded signal.

The variable length decoded signal is provided to inverse zig-zag and quantizer circuit 24 which, at inverse zig-zag and quantization step 52, decodes the variable length coded signal to provide a zig-zag decoded signal. Inverse zig-zag and quantizer circuit 24 produces actual DCT coefficients using a preset quantization step size. When a signal is encoded, data is run-length encoded in zig-zag ordering across an image so that compression is optimized. In general, most of the energy in an image is concentrated at the low frequency coefficients, which are conventionally written in the upper left corner of the transformed matrix, Therefore, image data which has been converted to a frequency representation typically has larger coefficients at lower spatial frequencies, clustered at the upper left corner of a frequency image block. Coefficients typically decrease along rays extending from the zero-frequency, or DC, term to higher spatial frequency terms. A block of data is compressed by discrete cosine transform (DCT) coefficient quantization. Discrete cosine transformation shifts the energy of the block to lower frequency coefficients. Quantization serves to remove small coefficients—coefficients that are smaller than a quantization step. Higher frequency coefficients have a larger quantization step. Zig-zag ordering is used to reorder the quantized discrete cosine transform (DCT) block of coefficients so that non-zero coefficients are transmitted first, thereby increasing transmission efficiency. The inverse zig-zag and quantization step 52 compensates for the fact that, while a compressed video signal is compressed in a zig-zag run length code fashion, the zig-zag decoded signal is provided to inverse DCT circuit 26 as sequential blocks of video information. Accordingly, this zig-zag decoded signal provides blocks which are in a suitable order for raster scanning across display 18.

When a signal is encoded, an image block is first transformed from the spatial domain to the frequency domain using the Discrete Cosine Transform (DCT), which separates the signal into independent frequency bands. Most of the frequency information is in the upper left corner of the resulting block. The zig-zag decoded signal is applied to inverse DCT circuit 26 to convert the frequency domain image into the spatial domain. The inverse DCT circuit 26, at inverse DCT step 54, performs an inverse discrete cosine transform on the zig-zag decoded video signal on a block-by-block basis to provide a statically decompressed video signal. This statically decompressed video signal corresponds to a single picture of video information. This single picture of video information may be used to present a static image on display 18 or may be used as a picture within a sequence of pictures for presentation of a motion image on display 18.

The statically decompressed signal is provided to adder 16 which, if the signal does not include any motion information (i.e., I pictures) provides this signal to display 18. However, for video signals which include motion information (i.e., B pictures and P pictures), adder 16 uses the forward motion compensation and backward motion compensation outputs from motion decode portion 19 to generate the video information which is provided to display 18 at motion compensation step 56. More specifically, forward motion vectors are used to locate information in previous picture store circuit 30 and backward motion vectors are used to locate information in future picture store circuit 32 and this information is added to the output provided by inverse DCT circuit 26.

VLC decoder 22 decodes a sequence of pictures in the following manner. VLC decoder 22 first decodes the header of a first picture, called picture 0, and determines that it is an I-picture. VLC decoder 22 produces quantized coefficients corresponding to the quantized DCT coefficients. These are assembled for each 8 by 8 block of pixels in the image by inverse zig-zag scanning. VLC decoder 22 decodes the header of the next picture, picture 3, and determines that it is a P-picture. For each inter-coded macroblock, the VLC decoder 22 decodes motion vectors giving the displacement from the stored previous picture, and quantized coefficients corresponding to the quantized DCT coefficients. The quantized DCT coefficients are error terms in the form of a difference block. For an intra-coded macroblock, all six blocks include IDCT values. For inter-coded or predicted macroblocks, not all six blocks include IDCT error terms. These quantized coefficients are inverse quantized to produce actual DCT coefficients. The coefficients are transformed into pixel difference values and added to the predicted block which are generated by applying the motion vectors to macroblocks in the stored previous picture. The resultant macroblock is displayed on display 18. This picture is not displayed until B-pictures 1 and 2 have been received, decoded, and displayed. VLC decoder 22 decodes the header of the next picture, picture 1, and determines that it is a B-picture. For each inter-coded macroblock, the VLC decoder decodes motion vectors giving the displacement from the stored previous or future pictures or both, and quantized coefficients corresponding to the quantized DCT coefficients of the difference block. These quantized coefficients are inverse quantized to produce actual DCT coefficients. The coefficients are inverse transformed into difference pixel values and added to a predicted macroblock produced by applying the motion vectors to the stored pictures. The resultant macroblock is stored in display 18. The macroblock is displayed at a suitable time.

One example of a method, executed by the VLC decoder 22, for parsing DCT VLC codes in a VLC bitstream is to use the VLC code as an index into a lookup table TABLE 1 containing a run length parameter and a level parameter for each DCT VLC code. Although this example illustrates parsing of DCT VLC codes, a similar method is employed for parsing macroblock addressing, macroblock type, macroblock pattern and motion vector VLC codes, for example. In the DCT VLC code method, a run length describes the advancement from one coded DCT coefficient to the next coded DCT coefficient in zig zag scan order. The level table value designates the level or amplitude of the DCT coefficient. The zigzag-scanned quantized DCT coefficient list is updated as follows for a first DCT coefficient (a variable length code for the first retrieved coefficient):

i=run;

if (s==0) dct_zz(i)=level;

if (s==1) dct_zz(i)=-level;

Terms of the first DCT coefficient are run-length encoded and dct_zz(i), i>=0 are set to zero initially. The zigzag-scanned quantized DCT coefficient list is updated as follows for a next DCT coefficient (a variable length code for a coefficient retrieved subsequently to the first coefficient):

i=i+run+1;

if (s==0) dct_zz(i)=level;

if (s==1) dct_zz(i)=-level;

If macroblock_intra is equal to 1 then the term i is set to one before the first next DCT coefficient of the block. The lookup table TABLE 1 is specified in the ISO/IEC 11172-2 standard in which:

1—The last bit 's' denotes the sign of the level, 'O' for positive '1' for negative.

2—This code shall be used for dct_coeff_first.

3—This code shall be used for dct_coeff_next.

TABLE 1

Variable length codes for dct_coeff_first and dct_coef_next

| dct_coeff_first and dct_coeff_next variable length code (NOTE1) | run | level |
| --- | --- | --- |
| 10 | end_of_block | |
| 1 s (NOTE2) | 0 | 1 |
| 11 s (NOTE3) | 0 | 1 |
| 011 s | 1 | 1 |
| 0100 s | 0 | 2 |
| 0101 s | 2 | 1 |
| 00101 1 s | 0 | 3 |
| 0011 1 s | 3 | 1 |
| 0011 0 s | 4 | 1 |
| 0001 10 s | 1 | 2 |
| 0001 11 s | 5 | 1 |
| 0001 01 s | 6 | 1 |
| 0001 00 s | 7 | 1 |
| 0000 110 s | 0 | 4 |
| 0000 100 s | 2 | 2 |
| 0000 111 s | 8 | 1 |
| 0000 101 s | 9 | 1 |
| 0000 01 | escape | |
| 0010 0110 s | 0 | 5 |
| 0010 0001 s | 0 | 6 |
| 0010 0101 s | 1 | 3 |
| 0010 0100 s | 3 | 2 |
| 0010 0111 s | 10 | 1 |
| 0010 0011 s | 11 | 1 |
| 0010 0010 s | 12 | 1 |
| 0010 0000 s | 13 | 1 |
| 0000 0010 10 s | 0 | 7 |
| 0000 0011 00 s | 1 | 4 |
| 0000 0010 11 s | 2 | 3 |
| 0000 0011 11 s | 4 | 2 |
| 0000 0010 01 s | 5 | 2 |
| 0000 0011 10 s | 14 | 1 |
| 0000 0011 01 s | 15 | 1 |
| 0000 0010 00 s | 16 | 1 |
| 0000 0001 1101 s | 0 | 8 |
| 0000 0001 1000 s | 0 | 9 |
| 0000 0001 0011 s | 0 | 10 |
| 0000 0001 0000 s | 0 | 11 |
| 0000 0001 1011 s | 1 | 5 |
| 0000 0001 0100 s | 2 | 4 |
| 0000 0001 1100 s | 3 | 3 |
| 0000 0001 0010 s | 4 | 3 |
| 0000 0001 1110 s | 6 | 2 |
| 0000 0001 0101 s | 7 | 2 |
| 0000 0001 0001 s | 8 | 2 |
| 0000 0001 1111 s | 17 | 1 |
| 0000 0001 1010 s | 18 | 1 |
| 0000 0001 1001 s | 19 | 1 |
| 0000 0001 0111 s | 20 | 1 |
| 0000 0010 0110 s | 21 | 1 |
| 0000 0000 1101 0 s | 0 | 12 |
| 0000 0000 1100 1 s | 0 | 13 |
| 0000 0000 1100 0 s | 0 | 14 |
| 0000 0000 1011 1 s | 0 | 15 |
| 0000 0000 1011 0 s | 1 | 6 |
| 0000 0000 1010 1 s | 1 | 7 |
| 0000 0000 1010 0 s | 2 | 5 |
| 0000 0000 1001 1 s | 3 | 4 |
| 0000 0000 1001 0 s | 5 | 3 |

TABLE 1-continued

Variable length codes for dct_coeff_first and dct_coef_next

| dct_coeff_first and dct_coeff_next variable length code (NOTE1) | run | level |
|---|---|---|
| 0000 0000 1000 1 s | 9 | 2 |
| 0000 0000 1000 0 s | 10 | 2 |
| 0000 0000 1111 1 s | 22 | 1 |
| 0000 0000 1111 0 s | 23 | 1 |
| 0000 0000 1110 1 s | 24 | 1 |
| 0000 0000 1110 0 s | 25 | 1 |
| 0000 0000 1101 1 s | 26 | 1 |
| 0000 0000 0111 11 s | 0 | 16 |
| 0000 0000 0111 10 s | 0 | 17 |
| 0000 0000 0111 01 s | 0 | 18 |
| 0000 0000 0111 00 s | 0 | 19 |
| 0000 0000 0110 11 s | 0 | 20 |
| 0000 0000 0110 10 s | 0 | 21 |
| 0000 0000 0110 01 s | 0 | 22 |
| 0000 0000 0110 00 s | 0 | 23 |
| 0000 0000 0101 11 s | 0 | 24 |
| 0000 0000 0101 10 s | 0 | 25 |
| 0000 0000 0101 01 s | 0 | 26 |
| 0000 0000 0101 00 s | 0 | 27 |
| 0000 0000 0100 11 s | 0 | 28 |
| 0000 0000 0100 10 s | 0 | 29 |
| 0000 0000 0100 01 s | 0 | 30 |
| 0000 0000 0100 00 s | 0 | 31 |
| 0000 0000 0011 000 s | 0 | 32 |
| 0000 0000 0010 111 s | 0 | 33 |
| 0000 0000 0010 110 s | 0 | 34 |
| 0000 0000 0010 101 s | 0 | 35 |
| 0000 0000 0010 100 s | 0 | 36 |
| 0000 0000 0010 011 s | 0 | 37 |
| 0000 0000 0010 010 s | 0 | 38 |
| 0000 0000 0010 001 s | 0 | 39 |
| 0000 0000 0010 000 s | 0 | 40 |
| 0000 0000 0011 111 s | 1 | 8 |
| 0000 0000 0011 110 s | 1 | 9 |
| 0000 0000 0011 101 s | 1 | 10 |
| 0000 0000 0011 100 s | 1 | 11 |
| 0000 0000 0011 011 s | 1 | 12 |
| 0000 0000 0011 010 s | 1 | 13 |
| 0000 0000 0011 001 s | 1 | 14 |
| 0000 0000 0001 0011 s | 1 | 15 |
| 0000 0000 0001 0010 s | 1 | 16 |
| 0000 0000 0001 0001 s | 1 | 17 |
| 0000 0000 0001 0000 s | 1 | 18 |
| 0000 0000 0001 0100 s | 6 | 3 |
| 0000 0000 0001 1010 s | 11 | 2 |
| 0000 0000 0001 1001 s | 12 | 2 |
| 0000 0000 0001 1000 s | 13 | 2 |
| 0000 0000 0001 0111 s | 14 | 2 |
| 0000 0000 0001 0110 s | 15 | 2 |
| 0000 0000 0001 0101 s | 16 | 2 |
| 0000 0000 0001 1111 s | 27 | 1 |
| 0000 0000 0001 1110 s | 28 | 1 |
| 0000 0000 0001 1101 s | 29 | 1 |
| 0000 0000 0001 1100 s | 30 | 1 |
| 0000 0000 0001 1011 s | 31 | 1 |

In addition to the above tabulated codes, the ISO/IEC 11172-2 standard also specifies several escape case codes. An escape code is a special codeword for coefficients which have unusual run and level values. Escape case codes occur infrequently in the VLC bitstream. In TABLE 2 and TABLE 3, encoding of run and level, respectively, following an escape code either as a 14—bit fixed length code (-127<= level <=127) or as a 22—bit fixed length code (-255<=level <=-128, 128<=level>-255). (Note—This yields total escape code lengths of 20-bits and 28-bits respectively). The ISO/IEC standard specifies the run escape codes in TABLE 2 as follows:

TABLE 2

| run | |
|---|---|
| fixed length code | run |
| 0000 00 | 0 |
| 0000 01 | 1 |
| 0000 10 | 2 |
| ... | ... |
| ... | ... |
| 1111 11 | 63 |

TABLE 3

| level | |
|---|---|
| fixed length code | level |
| forbidden | -256 |
| 1000 0000 0000 0001 | -255 |
| 1000 0000 0000 0010 | -254 |
| ... | |
| 1000 0000 0111 1111 | -129 |
| 1000 0000 1000 0000 | -128 |
| 1000 0001 | -127 |
| 1000 0010 | -126 |
| ... | |
| 1111 1110 | -2 |
| 1111 1111 | -1 |
| forbidden | 0 |
| 0000 0001 | 1 |
| ... | |
| 0111 1111 | 127 |
| 0000 0000 1000 0000 | 128 |
| 0000 0000 1000 0001 | 129 |
| ... | |
| 0000 0000 1111 1111 | 255 |

The maximum number of bits in a DCT VLC code that is not an escape code is sixteen bits. Therefore, a sixteen bit index is parsed to select an entry of lookup table TABLE 1. In contrast, escape codes are a fixed-length code so that no table lookup is used.

Parsing of the VLC bitstream using a lookup table approach is most efficient for decoding of lengthy bit codes. For short VLC codes, efficiency of the lookup table approach is limited since the method generally employs accessing of many bits which are not utilized for the decoding of a first code but which must be accessed again later for decoding of a subsequent code. Furthermore, the lookup table method involves steps of locating an appropriate lookup table, calculating an index to the table, determining the bitlength of a code, restoring bits which are not used and acquiring a VLC value from the table. Thus, checking of the table with a code value is typically slower than directly testing a few bits in a register for short VLC codes. An alternative method of parsing the bitstream involves usage of a binary tree search approach.

Figure 4:
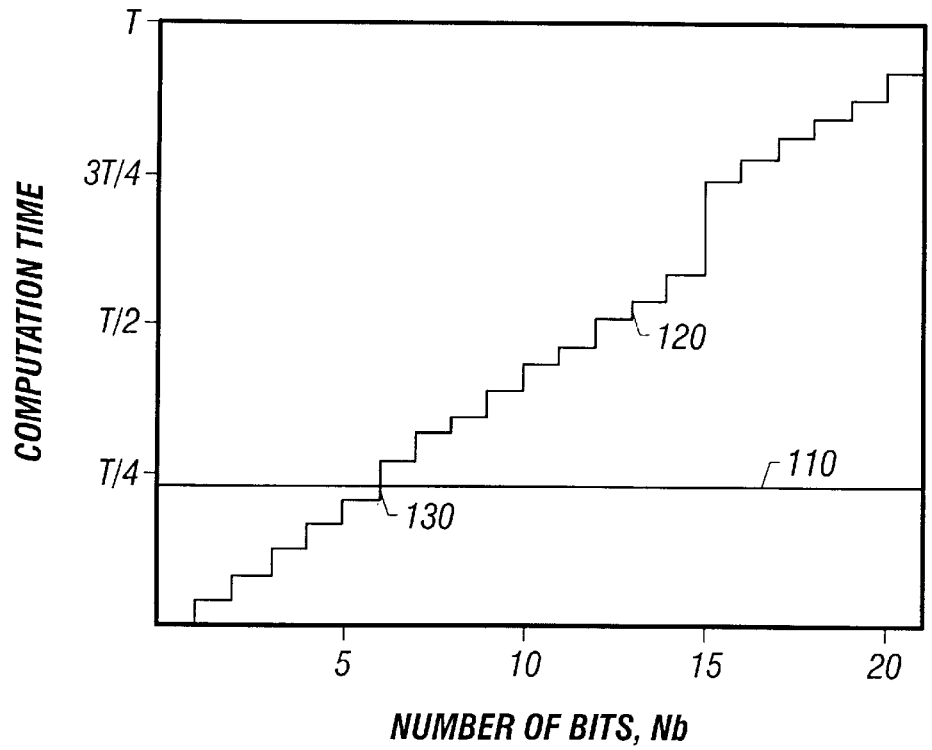
FIG. 4 is a graph which illustrates the computational burden incurred by parsing a VLC stream using a binary tree method and a lookup table approach.

The graph of FIG. 4 illustrates the computational burden of parsing a VLC stream using a binary tree method and a lookup table approach. The x-axis shows the number of bits parsed while the y-axis depicts the computational burden, for example in terms of computing time, to parse a code made up of a given number of bits. A line 110 shows the substantially constant computational burden using the lookup table approach alone. A stairstep function 120 illustrates the computational burden using the binary tree method, which increases as the number of bits parsed increases. Using the binary tree method, the stairstep function monotonically increases in computational burden well past the computational burden of the lookup table method.

Figure 5:
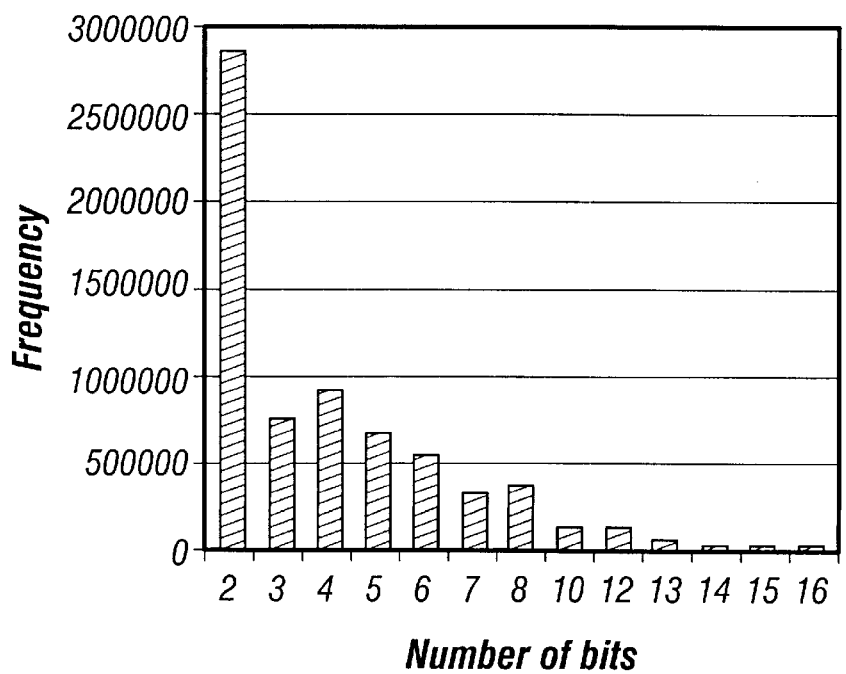
FIG. 5 illustrates, for a typical picture, a histogram of the frequency of occurrence of particular VLC codes as a function of the number of coded bits.

The point of intersection 130 of line 110 and stairstep function 120 designates the number of bits of a VLC code at which the table method becomes more efficient for longer bit codes and the binary tree search becomes more efficient for shorter bit codes. The importance of distinguishing between short and long VLC codes depends on the frequency at which VLC codes of different lengths occur. For a typical picture, FIG. 5 illustrates a histogram of the frequency of occurrence of particular VLC codes as a function of the number of coded bits. Typically shorter DCT VLC codes occur at a much higher frequency than long codes. Commonly, more than 60% of the DCT VLC codes in a picture are coded with less than five bits.

Accordingly, a disclosed hybrid method utilizes a binary tree search method in combination with a table lookup method. The hybrid method uses a preset number of bits $N_b$ for testing. The hybrid method acquires a VLC bitstream from the input buffer and checks the first $N_b$ bits of the stream, bit-by-bit, against defined short length codes. If a defined short length code matches, the hybrid algorithm sets the run length and level values accordingly and returns from the decoding function. If a defined short length code pattern is not found for the first $N_b$ bits, then an indexed table lookup method is used to find codes having a length greater than $N_b$.

Figure 6:
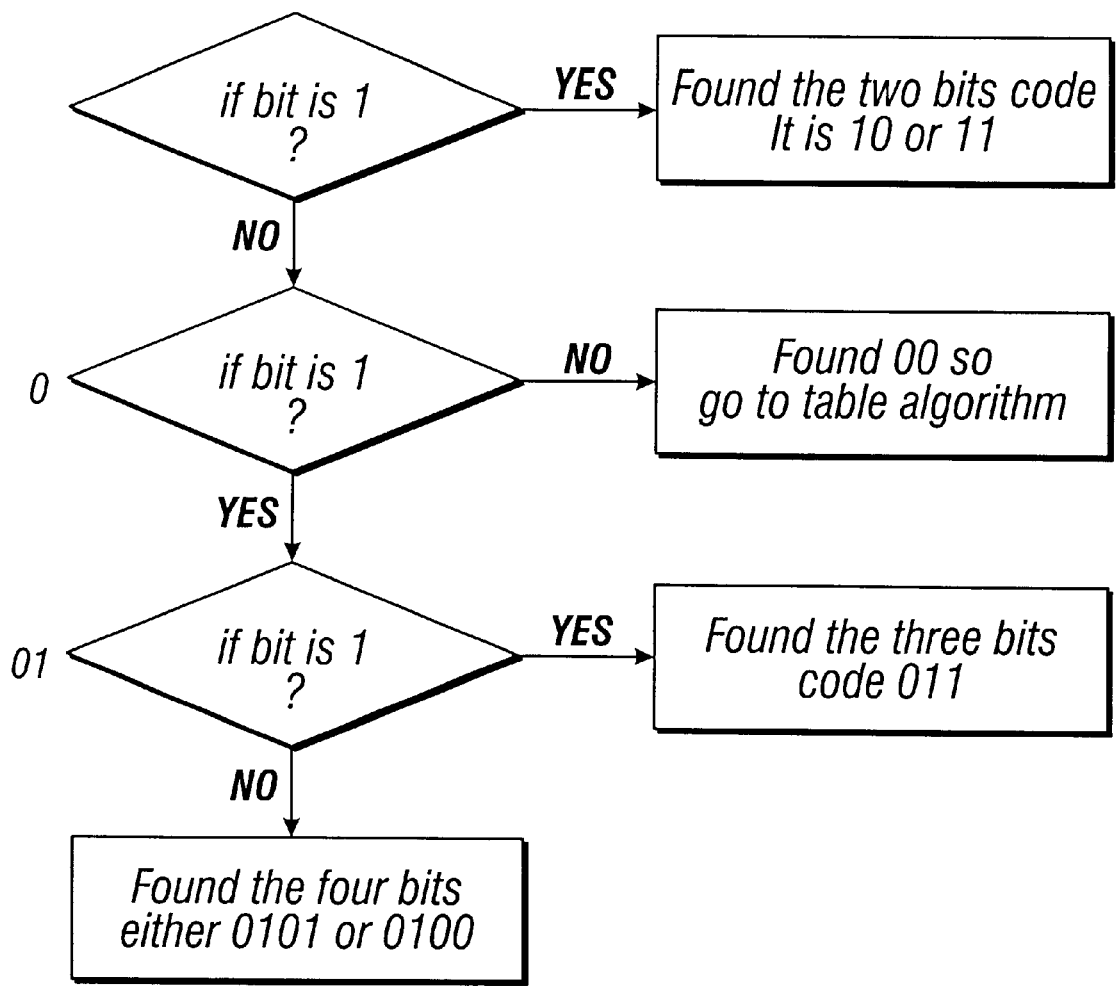
FIG. 6 is a flow diagram which illustrates the structure of a first embodiment of the binary search method within the hybrid process.

In an illustrative embodiment of the method, the value of the short length VLC code is hard-coded in processor instructions so that the hybrid method routine is terminated immediately upon matching of the VLC code pattern, thereby conserving decoding time. FIG. 6 is a flow diagram which illustrates the structure of the binary search method within the hybrid process. DCT coefficients which are coded by fewer than 5 bits are decoded using a bit test or binary tree searching. VLC codes with greater than 5 bits are decoded using a sixteen bit decimal value as an index into a lookup table.

Figure 7:
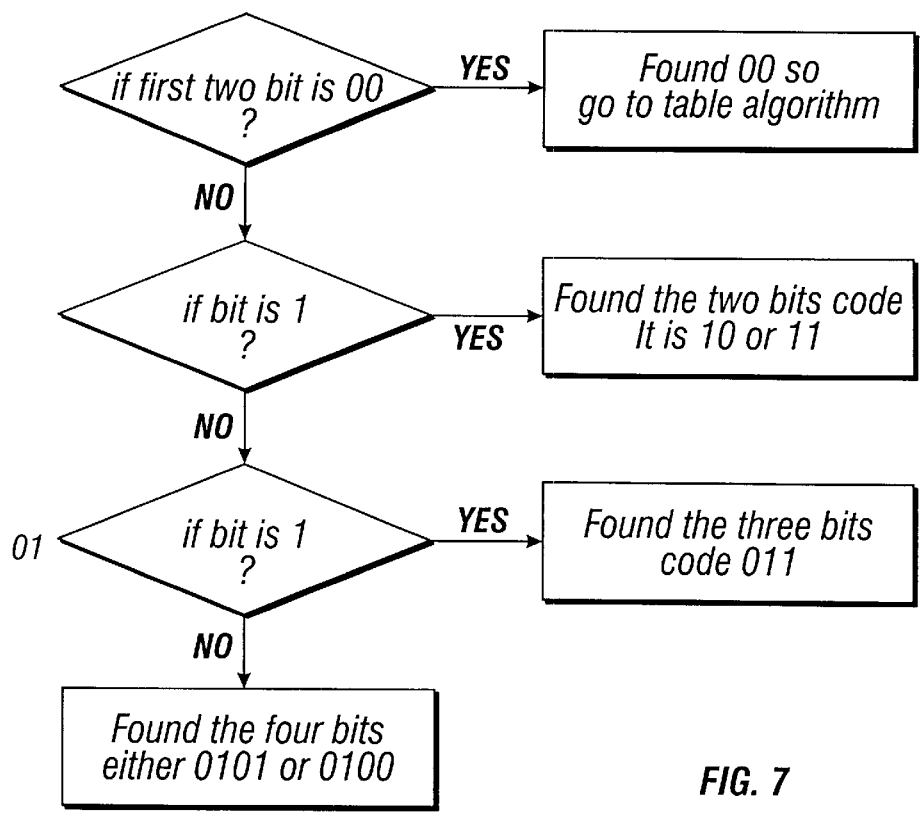
FIG. 7 is a flow diagram which illustrates the structure of an alternative embodiment of the binary search method within the hybrid process.

FIG. 7 is a flow diagram which illustrates the structure of an alternative embodiment of the binary search which conserves processing instructions incurred for lengthy codes using the hybrid method. Using this method, a switching test is added at the beginning of the binary search so that if the first two bits are zero, then the hybrid method immediately switches to the table algorithm. Otherwise, the binary search is utilized.

Figure 8:
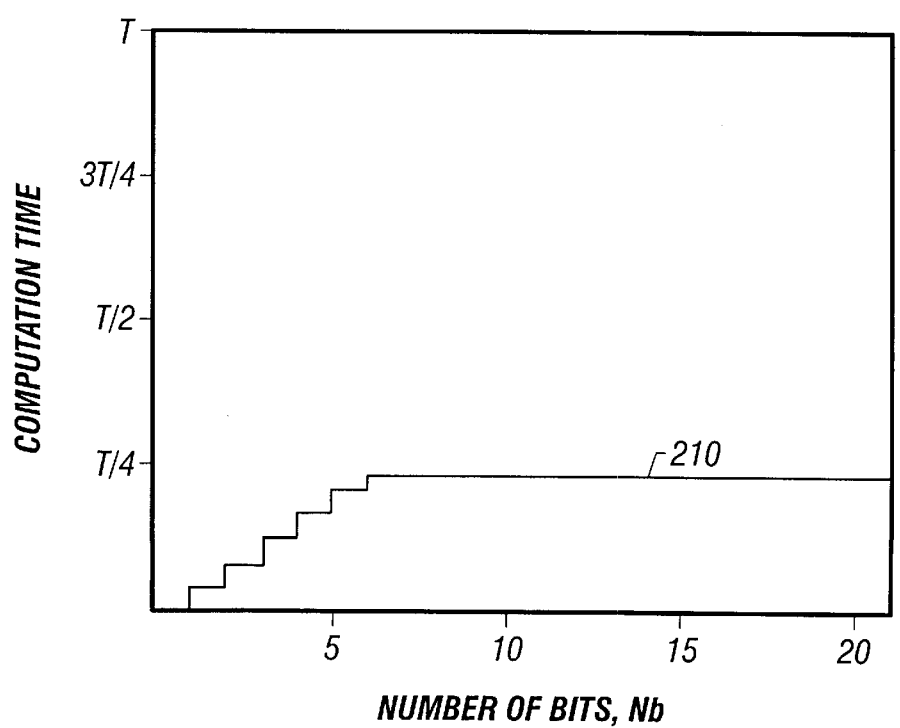
FIG. 8 is a graph which shows the computational burden incurred by the disclosed hybrid method.

The hybrid method is advantageous for efficiently decoding short VLC codes which occur frequently while avoiding the massive computational burden that an occasional lengthy VLC code would incur using the binary tree search method. The graph of FIG. 8 shows the improvement in computational efficiency of the disclosed hybrid method. A hybrid method line 210 shows the computational burden is minimized by utilizing a binary tree parsing method so long as the computational burden expended does not surpass the burden imposed when a lookup table method is used.

Furthermore, after a register is loaded with bitstream data from the input buffer, the order of bits is from left to right in the register. Thus a branch search utilizing testing of the first few bits at an upper part of the register is faster than shifting and masking the register.

Figure 9:
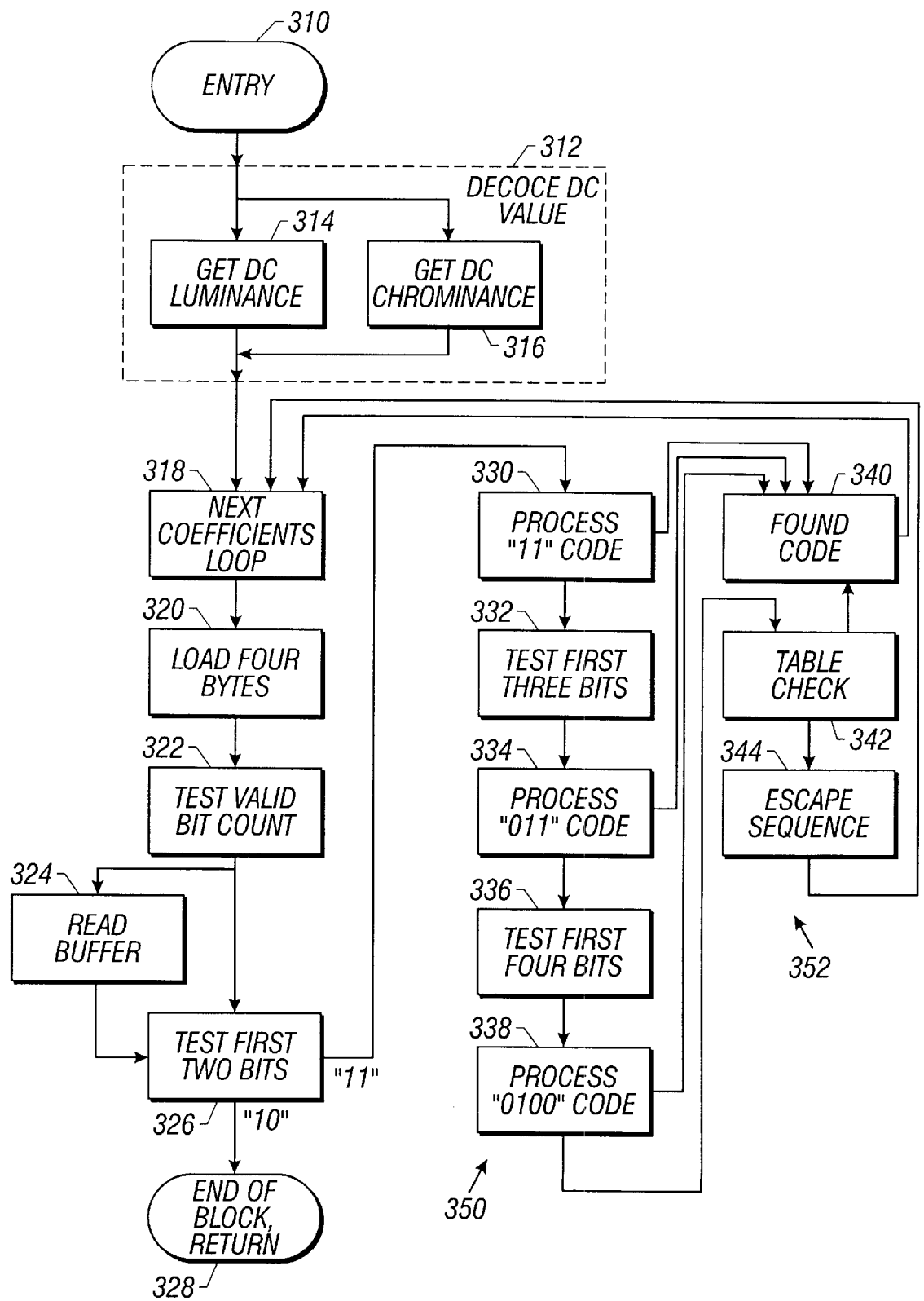
FIG. 9 illustrates a flow chart describing a hybrid method for parsing coded discrete cosine transform (DCT) coefficients of an intracoded block.

FIG. 9 illustrates a flow chart which describes a hybrid method for parsing coded discrete cosine transform (DCT) coefficients of an intracoded block. Intracoding of a macroblock or picture is a coding that uses information only from that macroblock or picture. An intracoded block is one of six blocks within one macroblock. Blocks 0–3 are luminance blocks and blocks 4 and 5 are chrominance blocks. A luminance block is a block representing a monochrome representation of a signal and related to the primary colors in the manner defined in CCIR Rec. 601. The symbol used for luminance is Y. A chrominance block is a block which represents one of the two color difference signals related to the primary colors in the manner defined in CCIR Rec 601. The symbols used for the color difference signals are Cr and Cb. Two input parameters are furnished upon entry 310 into the method processing. A first parameter is an identification number (0–5) of the block within the macroblock which is to receive the decoded bitstream data. A second parameter is a prediction value for the DC coefficient. The DC coefficient is the DCT element for which the frequency is zero in both spatial dimensions. The method accesses a data structure which furnishes three globally accessible components, including a pointer to a block to receive the decoded bitstream data, a count of the number of valid bits remaining in a buffer supplying the bitstream data and an array of quantization elements. The pointers to the input buffer point to a valid byte and to the invalid bits in the first valid byte so that, when the bitstream is loaded into a register, no calculation of a data starting point or data length are necessary. The quantization element array is a two dimensional (i,j) array containing elements designating one-eighth of the product of quantization scale values (i) and intracoded quantization matrix values (j). Additionally, the method acquires data from an input buffer which contains a coded data stream and the method supplies a data memory of decoded data at a block location designated by the block pointer.

The first coefficient of the block is the DC coefficient, which is decoded in decode DC value step 312. If the block identification number is less than four, the block is a luminance block and a luminance difference value is decoded in get DC luminance step 314. Otherwise, the block is a chrominance block and a chrominance difference value is decoded in get DC chrominance step 316. Also in decode DC value step 312, the difference value found in step 314 or 316 is added to the prediction value for the DC coefficient.

Additional coefficients of the block are then decoded, beginning with next coefficients loop step 318. Four bytes of bitstream data are acquired from the input buffer in load four bytes step 320. If too few valid bits remain in the buffer for additional parsing, test valid bit count step 322 selectively activates read buffer step 324 to access four bytes of data from the buffer. Generally, frequently-occurring DCT VLC codes have fewer than 5 bits so that, if the number of valid bits in a register is larger than five, then there is no need to reload the coded bitstream from input buffer to the register. As bits of the buffer are processed, the bits which have already been processed are termed invalid bits and the remaining bits to be processed are called valid bits. Loading of the bitstream from the input buffer orders the valid bits from most significant bit (MSB) to least significant bit (LSB) in a register so that a branch search by testing the first few bits at the upper part of the register is faster than shifting and masking the bits at the lower portion of the register. Furthermore, pointers to the input buffer include a first pointer to the valid byte and a second pointer to the invalid bits in the first valid byte so that when the bitstream is loaded from the input buffer to a register, no calculation of starting point in the buffer or bits to be shifted are necessary.

The first two valid bits of the bitstream are accessed from the buffer in test first two bits step 326 to determine whether the bits designate the values "10" or "11". If so, process first two bits step 326 either terminates the method in end of block return step 328 when the two bits designate the "10" value or processes a "11" value in process "11" code step 330. The end of block symbol indicates that no additional non-zero coefficients are present. Process "11" code step 330 advances the valid bit count two bits to the position of a sign bit, sets the level to 1 and branches to found code step 340. If the first two bits do not designate values "10" or "11", test first three bits step 332 determines whether the three bits designate a "011" value and, if so, process "011" code step 334 advances the valid bit count three bits to the position of a sign bit, advances the run length by 1, sets the level to 1 and branches to found code step 340. If the first three bits do not designate value "011", test first four bits step 336 determines whether the four bits designate a "0100" or a "0101" value. If a "0100" code is designated, process "0100" code step 338 advances the valid bit count four bits to the position of a sign bit, sets the level to 2 and branches to found code step 340. If a "0101" code is designated, process "0100" code step 338 advances the valid bit count four bits to the position of a sign bit, advances the run length by 2, sets the level to 1 and branches to found code step 340. If the first four bits do not designate values "0100" or a "0101" value, test first four bits step branches to table check step 342.

At found code step 340 which is also called a comparator step for determining whether the tested bits include a complete VLC code, the procedure has found a complete and proper code and found code step 340 converts the code into a decoded value. Found code step 340 then loads a decoded value resulting from the conversion into a block location designated by the block pointer. The decoded value is attained by utilizing the run length parameter as an array index into a zig__zag scan array. The zig__zag scan array is an 8×8 array of discrete cosine transform (DCT) coefficients in a zig zag order. Zig zag order is shown in TABLE 4 as follows:

TABLE 4

| 0  | 1  | 5  | 6  | 14 | 15 | 27 | 28 |
|----|----|----|----|----|----|----|----|
| 2  | 4  | 7  | 13 | 16 | 26 | 29 | 42 |
| 3  | 8  | 12 | 17 | 25 | 30 | 41 | 43 |
| 9  | 11 | 18 | 24 | 31 | 40 | 44 | 53 |
| 10 | 19 | 23 | 32 | 39 | 45 | 52 | 54 |
| 20 | 22 | 33 | 38 | 46 | 51 | 55 | 60 |
| 21 | 34 | 37 | 47 | 50 | 56 | 59 | 61 |
| 35 | 36 | 48 | 49 | 57 | 58 | 62 | 63 |

Found code step 340 determines the result of the ISO/IEC 11172-2 standard equation:

$$dct\_recon[m][n]=(2*dct\_zz[i]*quantizer\_scale*intra\_quant[m][n])/16.$$

In this equation, the found element of the zigzag-scanned quantized DCT coefficient list, Dct__zz[ ], refers to a particular VLC level. The intracoded quantization matrix, intra__quant[n][m], refers generally to a particular quantizer matrix element, quantizer__matrix[i]. The matrix of reconstructed DCT coefficients of a block, dct__recon[m][n], refers to a particular found coefficient, coeff[i], which relates to a particular element of the quantizer__matrix[i]. Accordingly, the ISO/IEC 11172-2 standard equation is simplified to an equation as follows:

$$coeff[i]=quantizer\_scale*quantizer\_matrix[i]*VLC\_level/8.$$

Execution of multiplication and division instructions is relatively burdensome, therefore computational efficiency is enhanced by precalculating the multiplication operation of quantizer__scale and quantizer__matrix[i] and the division by 8. The precalculated value is saved in a quantization value table for decoding of individual coefficients. For decoding intracoded blocks from multiple VLC codes in a bitstream, the quantization value table, qvatable[i][j], is defined as:

$$qvatable[i][j]=i*quantizer\_matrix[j]/8,$$

where i is a quantization scale value, j is a scan location in a block. After definition of the intracode quantizer matrix at the sequence header, the quantization value table is precalculated. The quantization value table is utilized in the decoding of all intracoded blocks in the sequence.

The run length parameter is applied as the array index into the zig__zag scan array to acquire a second array index into the intracode quantization value table. The first array index into the intracode quantization value table is a quantizer scale parameter. The quantizer scale is a five-bit integer which is used by the decoder to calculate discrete cosine transform DCT coefficients from transmitted quantized coefficients. A value of 0 is not allowed, so the quantizer scale has an integer value between 1 and 31. A quantizer scale value applies to an entire macroblock. The first and second array indices are applied to the intracode quantization value table, together with the level value, to yield a decoded value. The decoded value is forced to an odd value in an oddification process. Oddification disallows even valued numbers to prevent accumulation of mismatch errors.

Found code step 340 then accesses a sign bit from the buffer and, if the sign is negative, complements the oddified and decoded value to furnish a negative value. Found code step 340 then advances the valid bit count one bit to the beginning of the next code. In some embodiments of the method, found code step 340 then performs a saturation check and limit operation in which a positive value is limited to 2047 and a negative value is limited to −2048. In these embodiments, a saturation checking operation is also performed following the inverse discrete cosine transform (IDCT) operation.

In other embodiments, the saturation check and limit operation during DCT VLC decoding is not performed. Saturation checking is optional in DCT VLC decoding in these embodiments because the saturation checking operation following the inverse discrete cosine transform (IDCT) operation prevents reconstructed pixels outside the allowed range of 0–255. Eliminating the saturation checking operation following DCT VLC decoding allows a small amount of range violation for the decoded DCT coefficient. But this violation is corrected by the saturation check in the IDCT step. The overall result of the elimination of saturation checking in DCT VLC decoding is that a small amount of noise is added to the decoded video signal. However, this noise ranges in amplitude from −1 to +1 in the encoded coefficients. Noise of this size, after IDCT and saturation checking operations which convert the coefficients to the range of a pixel value, is not detectable by the human eye. Thus, elimination of saturation checking accelerates processing of VLC decoding and IDCT, and minimally reduces video quality.

Found code step 340 then branches to test valid bit count step 322 to continue parsing the buffer stream.

Table check step 342 first checks to determine whether the valid bit count is less than sixteen bits. If so, an additional four bytes of bitstream data are accessed from the buffer. Table check step 342 then tests the first sixteen bits of bitstream data. Several tables are furnished including a table (DCTtab0) for 5 to 8 bit length codes, a table (DCTtab1) for 10 bit length codes, a table (DCTtab2) for 12 bit length codes, a table (DCTtab3) for 13 bit length codes, a table (DCTtab4) for 14 bit length codes, and a table (DCTtab5)

for 15 bit length codes, a table (DCTtab6) for 16 bit length codes. Each table includes a run length entry, a level entry and a bit length entry.

If the code designated by the bitstream data is greater than or equal to 1024, the 5_to_8 bit code table DCTtab0 is accessed to acquire a run length designation, a bit length designation, and level designation. First the run designation is acquired and checked. If the run length is 65, then table check step 342 advances the valid bit count six bits and branches to an escape sequence step 344. Otherwise, table check step 342 accesses the bit length and level designations. Table check step 342 then advances the run length by the run length designation from the table, saves the level designation for later usage, and advances the valid bit count the number of bits set by the bit length designation. Table check step 342 then branches to found code step 340.

If the code designated by the bitstream data is greater than or equal to 512, the 10 bit code table DCTtab1 is accessed to acquire the run length, bit length and level designations. For codes greater than or equal to 256, the 12 bit code table DCTtab2 is accessed. For codes greater than or equal to 128, the 13 bit code table DCTtab3 is utilized. For codes greater than or equal to 64, the 14 bit code table DCTtab4 is utilized. For codes greater than or equal to 32, the 15 bit code table DCTtab5 is read. For codes greater than or equal to 16, the 16 bit code table DCTtab6 is accessed. Table check step 342 accesses the run length, bit length and level designations. Table check step 342 then advances the run length by the run length designation from the table, saves the level designation for later usage, and advances the valid bit count the number of bits set by the bit length designation. For each code, table check step 342 branches to found code step 340.

Escape sequence step 344 first checks to determine whether the valid bit count is less than 22 bits. If so, an additional four bytes of bitstream data are accessed from the buffer. Escape sequence step 344 uses the first six valid bits from the buffer as a run number. Escape sequence step 344 increments the run length by the running number and advances the valid bit count six bits. The run length is applied as an array index into the zig_zag scan array to acquire the second array index of the intracode quantization value table. The first array index into the intracode quantization value table is the quantizer scale parameter. Escape sequence step 344 then uses the next eight valid bits from the buffer as the level value and advances the valid bit count eight bits.

If the level value is equal to zero, escape sequence step 344 then uses an additional next eight valid bits from the buffer as the level value and advances the valid bit count eight bits. Escape sequence step 344 then multiplies the level value times the intracode quantization value table entry designated by the first and second array indices and sets the block value designated by the block pointer to the product.

If the level value is less than 128, escape sequence step 344 multiplies the level value times the intracode quantization value table entry designated by the first and second array indices and sets the block value designated by the block pointer to the product.

If the level value is greater than 128, escape sequence step 344 subtracts 256 from the level value, multiplies the level value after subtraction times the intracode quantization value table entry designated by the first and second array indices and sets the block value designated by the block pointer to the product.

If the level value is equal to 128, escape sequence step 344 uses an additional next eight valid bits from the buffer as the level value and advances the valid bit count eight bits. Escape sequence step 344 then subtracts 256 from the level value, multiplies the level value after subtraction times the intracode quantization value table entry designated by the first and second array indices and sets the block value designated by the block pointer to the product. The escape sequence is used to decode an escape code.

Steps 320 through 340 are included in a first code translator 350, specifically a bit-test translator, of the hybrid decoding technique. Steps 342 and 344 are included in a second code translator 352, specifically a lookup table translator, of the hybrid decoding technique.

Figure 10:
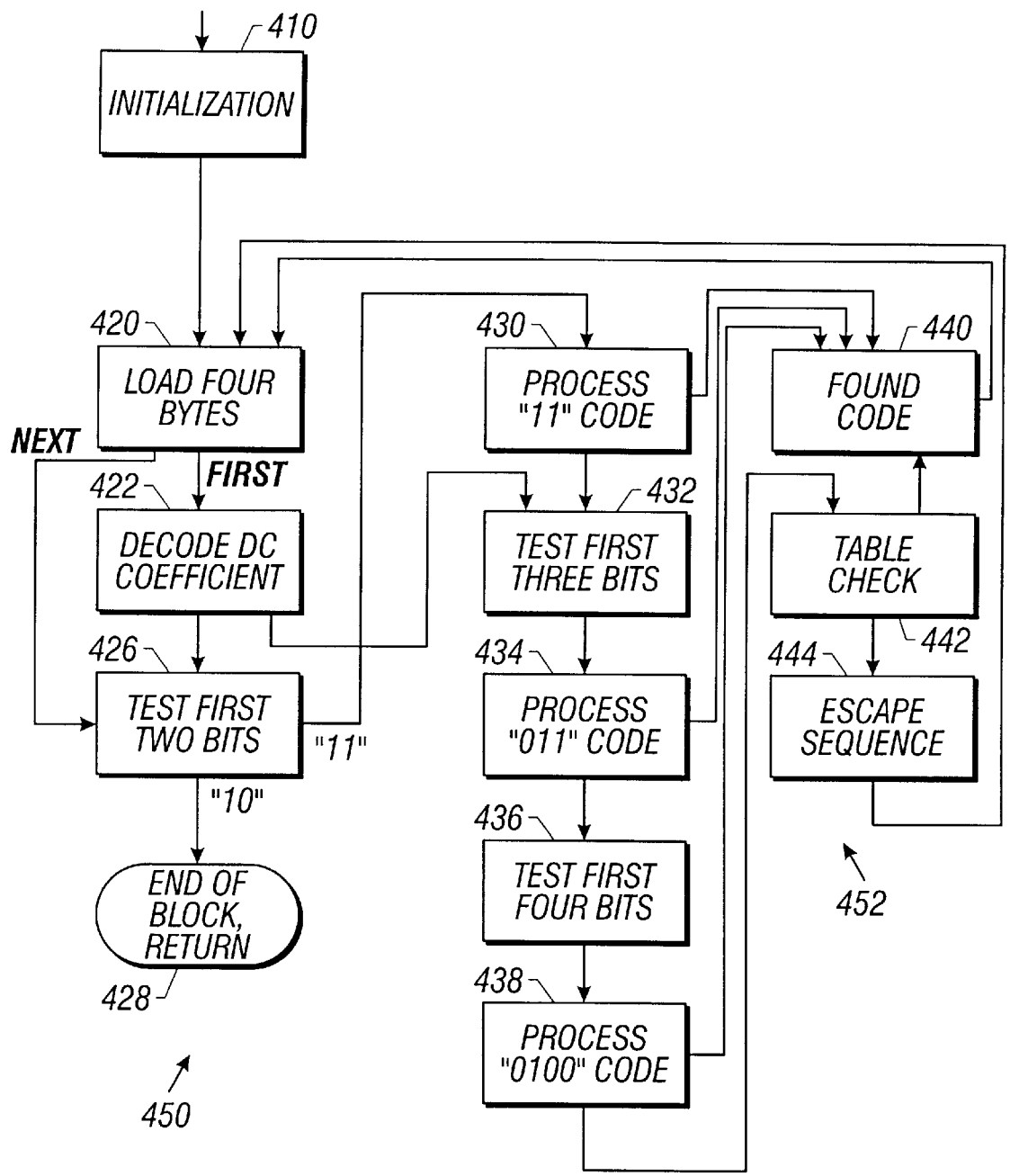
FIG. 10 illustrates a flow chart describing a hybrid method for parsing coded discrete cosine transform (DCT) coefficients of an intercoded block.

FIG. 10 illustrates a flow chart which describes a method for parsing coded discrete cosine transform (DCT) coefficients of an intercoded block. Intercoding of a macroblock or picture designates a coding on the basis of information from another macroblock or picture. The method acquires data from an input buffer which contains a coded data stream and the method supplies a data memory of decoded data at a block location designated by the block pointer. The first step of method is an initialization step 410 which accesses a data structure furnishing four globally accessible components, including a pointer to a block for receiving the decoded bitstream data, a count of the number of valid bits remaining in a buffer supplying the bitstream data and two precalculated quantization elements. A first quantization element is a level value designating one-eighth of the product of a quantization scale value and an intercoded quantization value corresponding to the level 1 table entry shown in TABLE 1. A second quantization element is a level value of twice the first quantization element, representing one-eighth of the product of a quantization scale value and an interceded quantization value corresponding to the level 2 table entry shown in TABLE 1. The interceded block parsing method efficiently utilizes precalculated and stored quantization elements. For decoding of a DCT code of an interceded block, multiplication between the quantization scale and the non intracoded quantizer matrix are precalculated for a particular macroblock. Only the changing of the quantization scale leads to possible recalculation of the multiplication. Furthermore, only the first element of the non intracoded quantizer matrix is used for calculation. In contrast the intracoded block parsing method accesses the quantization scale value and the intracode quantization value table. The interceded block parsing method is able to avoid this computational burden since: (1) all intercoded coefficients use the same quantization step, (2) only two level coefficients—level 1 and level 2 are included in TABLE 1 for the first five codes, which are prestored as global dequantized values, and (3) other level coefficients are derived by one multiplication between the level value and the global first level dequantized value. In addition to accessing these components from the global buffer, initialization step also initializes a run length parameter to the value of zero.

Following initialization step 410, coefficients of the block are decoded, beginning with load four bytes step 420 which acquires four bytes of bitstream data from the input buffer. Then, using a method somewhat similar to the method discussed with respect to FIG. 10, the bitstream is decoded. Decode DC coefficient step 422 illustrates one difference between the decoding of an intracoded block and the decoding of an interceded block. Decode DC coefficient step 422 is performed only when the first non-zero coefficient is decoded. In this instance, if the first bit code has a "1" value, what is encoded is the DC coefficient (dct_coeff_first) for the new block in which the run is 0 and the level 1 (see NOTE2 of TABLE 1). If the first bit of the DC coefficient is a 0 level bit, the code is a three or greater bit code and the method branches to test first three bits step 432. After the first coefficient is decoded, the first two valid bits of the bitstream are accessed from the buffer in test first two bits step 426 to determine whether the bits designate the values "10" or "11". If so, process first two bits step 426 either terminates the method in end of block return step 428 when the two bits designate the "10" value or processes a "11" value in process "11" code step 430. Process "11" code step 430 advances the valid bit count two bits to the position of a sign bit, sets the level to 1 and branches to found code step 440 which is also called a comparator step for determining whether the tested bits include a complete VLC code.

If the first two bits do not designate values "10" or "11", test first three bits step 432 determines whether the three bits designate a "011" value and, if so, process "011" code step 434 advances the valid bit count three bits to the position of a sign bit, advances the run length by 1, sets the level to 1 and branches to found code step 440. If the first three bits do not designate value "011", test first four bits step 436 determines whether the four bits designate a "0100" or a "0101"value. If a "0100" code is designated, process "0100" code step 438 advances the valid bit count four bits to the position of a sign bit, sets the level to 2 and branches to found code step 440. If a "0101" code is designated, process "0100" code step 438 advances the valid bit count four bits to the position of a sign bit, advances the run length by 2, sets the level to 1 and branches to found code step 440. If the first four bits do not designate values "0100" or a "0101" value, test first four bits step branches to table check step 442.

Found code step 440 determines the result of the ISO/IEC 11172-2 standard equation for interceded blocks, as follows:

$$dct\_recon[m][n] = (((2*dct\_zz[i]) + \text{Sign}(dct\_zz\{i\}))*$$
$$quantizer\_scale*non\_intra\_quant[m][n])/16,$$

in accordance with the aforementioned simplified equation:

$$coeff[i] = quantizer\_scale*quantizer\_matrix[i]*VLC\_level/8.$$

Computational efficiency is enhanced by precalculating the multiplication operation of quantizer_scale and quantizer_matrix[i] and the division by 8. The precalculated value is saved in a quantization value table for decoding of individual coefficients. For interceded blocks, elements in the quantizer matrix non_intra_quant[ ][ ] are all identical so that quantizer_matrix[i] is equal to quantizer_matrix [0], for example. Thus for decoding interceded blocks from multiple VLC codes in a bitstream, the quantization value table, qvtable[j], is defined as:

$$qvtable[j] = j*quantizer\_matrix[0]/8,$$

where j is an integer value from 1 to 31 designating quantization scale. The values in this table are determined after the non_intra_quant_matrix is defined at the sequence header.

When a new quantization scale is specified in a macroblock header, a level 1 dequantized value and a level 2 dequantized value are recalculated. The level 1 dequantized value is determined by applying the new scale value as the index of the intercode quantization value table. The level 2 dequantized value is twice the level 1 dequantized value. These two level dequantized values, which are constant for all blocks of a macroblock, are stored as two global dequantized elements.

Found code step 440 replaces the level 1 and level 2 coefficients with the global level 1 and level 2 dequantized value. Other level coefficients receive dequantized values by multiplying the level value with the level 1 dequantized value.

Found code step 440 loads a decoded value into a block location designated by the block pointer. The run length parameter is applied as the array index into the zig_zag scan array to acquire an increment value for pointing to an element of the decoding buffer. The level value set in prior steps is used to determine the dequantization value. Found code step 440 then accesses a sign bit from the buffer and, if the sign is negative, complements the oddified and decoded value to furnish a negative value. Found code step 440 then advances the valid bit count one bit to the beginning of the next code. Found code step 440 then branches to process first two bits step 426 to continue parsing the buffer stream.

Table check step 442 of the interceded block parsing method is substantially the same as table check step 342 of the intracoded block parsing method except that the precalculated and stored level 1 dequantized value is applied to determine a dequantized coefficient value, rather than the intracode quantization value table. Escape sequence step 444 of the interceded block parsing method is substantially the same as escape sequence step 344 of the intracoded block parsing method except that, rather than using the intracode quantization value table, the precalculated and stored level 1 dequantized value is applied to determine a dequantized coefficient value.

Steps 420 through 440 are included in a first code translator 450, specifically a bit-test translator, of the hybrid decoding technique. Steps 442 and 444 are included in a second code translator 452, specifically a lookup table translator, of the hybrid decoding technique.

Figure 11:
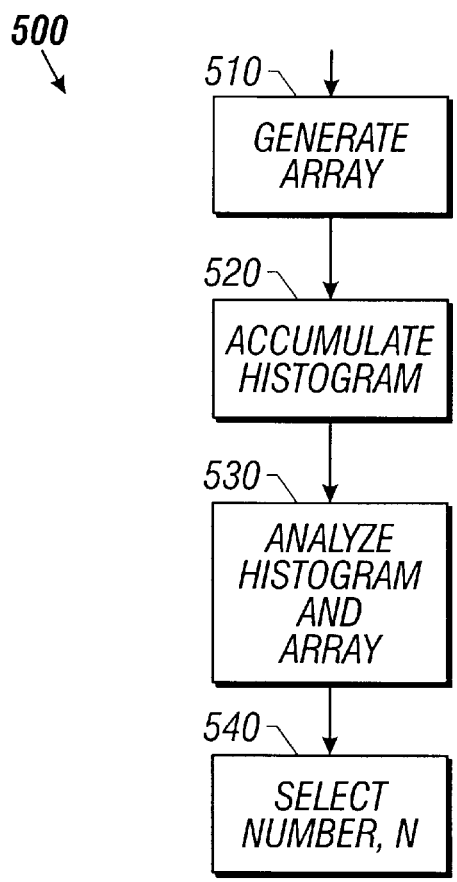
FIG. 11 illustrates a flow chart describing a method for adaptively determining the number of bits $N_b$ that efficiently partition the hybrid algorithm between the binary search and table lookup approaches.
Figure 12:
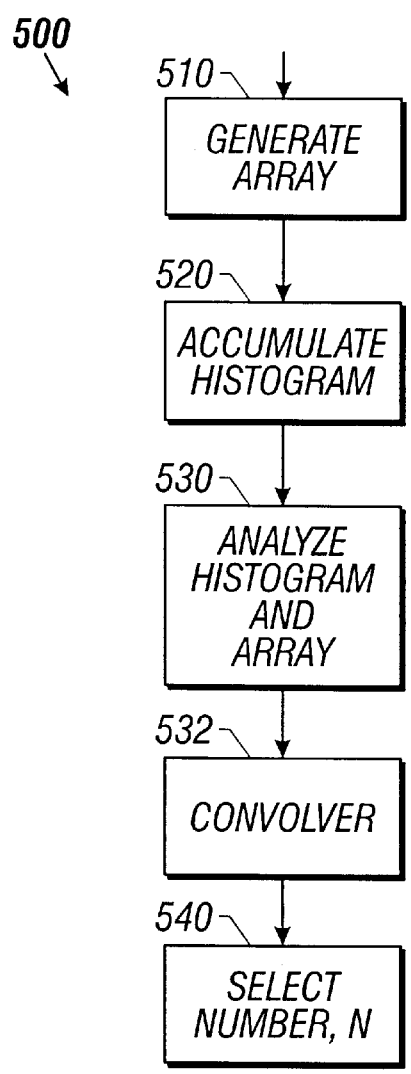
FIG. 12 illustrates a flow chart describing an alternative method for adaptively determining the number of bits $N_b$ that efficiently partition the hybrid algorithm between the binary search and table lookup approaches.

Referring to FIG. 11, a flow chart describes an adaptive controller 500 method for adaptively determining the number of bits $N_b$ that efficiently partition the hybrid algorithm between the binary search and table lookup approaches as a function of actual distribution codes with a VLC bitstream. A first step of the method of adaptively selecting the number $N_b$ step is generate array step 510 which generates an array designating parsing time for a parsing a plurality of VLC codes according to VLC code length. In one embodiment, generate array step 510 is achieved using an initialization function which sets up particular codes in the input buffer, initializes a clock, then detects the time utilized to parse each particular code having a particular code length. In an alternative embodiment, generate array step 510 is performed manually by adding the execution durations of instructions used in the parsing operation for various code lengths. A second step of the adaptive selecting procedure is an accumulate histogram step 520 which accumulates a histogram of the frequency of occurrence of VLC codes according to VLC code length. The accumulate histogram step 520 is achieved by counting the number of occurrences of various VLC code lengths for a particular test picture or set of pictures. A third step of the adaptive selection procedure is an analyze histogram and array step 530 which appraises the information gathered in generate array step 510 and accumulate histogram step 520 to determine an appropriate number of bits N. In one embodiment, analyze histogram and array step 530 examines the histogram to determine the number of bits $N_b$ for which a selected percentage of the codes, for example 60% to 80%, have fewer bits than $N_b$. In another embodiment, analyze histogram and array step 530 performs a convolution operation (convolver 532 shown in FIG. 12) between the parsing time array and the histogram in accordance with the equation:

$$y(n) = \sum_{k} (x(k) \times h(n-k)),$$

where x is the array of parsing time and h is the histogram of frequency of occurrences. A select number $N_b$, step 540 selects the number of bits $N_b$ in accordance with the result of the convolution operation. For example, the number of bits $N_b$ is set to the number N at the minimum value of the convolution result.

The description of certain embodiments of this invention is intended to be illustrative and not limiting. Numerous other embodiments will be apparent to those skilled in the art, all of which are included within the broad scope of this invention. For example, the embodiments described herein are computer-based implementations. Electronic circuit based embodiments which perform the same function are expressly included within the scope of the claims. Furthermore, the number of bits $N_b$ for determining whether the binary tree search or the table lookup is utilized has various different preset or adaptively-determined values in accordance with the various VLC tables specified in the MPEG specification, ISO/IEC 11172-2. For example, the variable length code (VLC) tables for macroblock addressing, macroblock type, macroblock pattern, motion vectors and DCT coefficients may utilize different Nb values. Specifically, for example, a macroblock address increment VLC decoding process utilizes decoding by binary search for codes less than 4 bits in length and utilizes table checking for codes longer than 4 bits. In another example, a coded block pattern VLC decoding process utilizes decoding by binary search for codes less than 3 bits in length and utilizes table checking for codes longer than 3 bits. For motion vector decoding, codes of fewer than 5 bits are decoded using the binary search and longer codes are decoded using a table search.

For discrete cosine transform (DCT) DC coefficient size VLC coding, no table checking is used. Bit testing is performed in the following manner. For luminance data, a first bit is accessed. If the first bit is 0, a second bit is accessed to decode either "00" or "01" codes. If the first bit is 1, access the second bit and, if the second bit is 0, then a third bit is accessed to decode either "100" or "101" codes. Otherwise, when the first and second bits are "11", a third bit is checked to check code 0 to "11110" using the binary tree structure. For chrominance data, a first bit is accessed. If the first bit is 0, a second bit is accessed to decode either "00" or "01" codes. If the first bit is 1, check the second bit and, if the second bit is 0, then code "10" is decoded. Otherwise, when the first and second bits are "11", a third bit is checked to check code 0 to "111110" using the binary tree structure.

What is claimed is:

1. A method of decoding variable length code (VLC) data comprising:
   receiving a plurality of bits of coded bitstream data in a sequence;
   individually testing the bits in the sequence sequentially up to a preselected number N bits of the plurality of bitstream bits;
   determining whether the sequence of individually tested bits is a valid VLC code;
   when the sequence of individually tested bits is a valid VLC code, selecting a short length VLC code decoded value that is hard-coded in processor instructions and predefined to correspond to the valid VLC code; and
   otherwise decoding a VLC code decoded value by forming an address pointer from the plurality of bits of the coded bitstream data and applying the address pointer to select a table element of a lookup table having a plurality of table elements.

2. A method according to claim 1 wherein the VLC data is encoded data of a data type selected from the group of data types including discrete cosine transform (DCT) coefficients, macroblock addresses, macroblock types, macroblock patterns, and motion vectors.

3. A method according to claim 1 wherein the bit testing and determining steps include:
   individually testing a minimum number of bits M sequentially in the sequence;
   determining whether the M bits specify a valid VLC code; and
   progressively bit testing additional bits, individually and in the sequence, and determining whether a valid VLC code is specified by the sequence for each additional bit.

4. A method according to claim 1 wherein coefficients coded by fewer than N=5 bits are decoded by individually testing bits in the sequence and coefficients decoded by more than N=5 bits are decoded by reading data from the lookup table using 16 bits of the bitstream to address the lookup table.

5. A method according to claim 1, further comprising:
   adaptively selecting the number N as a function of frequency of occurrence of VLC codes according to decoded VLC code length.

6. A method according to claim 5, further comprising:
   accumulating a histogram by counting the number of occurrences of codes at a plurality of VLC code lengths; and
   examining the histogram to determine the number of bits $N_b$ for which a selected percentage of the codes have fewer bits than $N_b$.

7. A method according to claim 6 wherein the selected percentage of codes is a percentage in the range from 60% to 80%.

8. A method according to claim 1, further comprising:
   adaptively selecting the number N as a function of a bit code parsing time and frequency of occurrence of VLC codes according to decoded VLC code length.

9. A method according to claim 8, wherein adaptively selecting the number N step further comprises:
   generating an array designating parsing time for a parsing a plurality of VLC codes according to VLC code length;
   accumulating a histogram of frequency of occurrence of VLC codes according to VLC code length;
   performing a convolution operation between the parsing time array and the histogram; and
   selecting the number of bits N in accordance with the result of the convolution operation.

10. A method according to claim 1 wherein testing the sequence of bits comprises:
    accessing bitstream data from an input buffer in an order from most significant bit to least significant bit;
    testing bits beginning from the most significant bit; and
    logically branching as directed by a result of the tested bits.

11. A method according to claim 1 wherein receiving a plurality of bits of coded bitstream data comprises:
    accessing data bits from an input buffer;
    tracking a valid byte of the data bits using a valid byte pointer; and
    tracking an invalid bit in the valid byte using an invalid bit pointer.

12. A method according to claim 11 further comprising:
updating the valid byte pointer and the invalid bit pointer as valid VLC codes and VLC code addresses are found.

13. A computer program product for usage in a video system including a VLC decoder, the computer program product comprising:
a computer usable medium having computable readable code embodied therein including a computer program for executing the method according to claim 1.

14. An apparatus for decoding a variable length code (VLC) comprising:
a memory including a lookup table having a plurality of table elements;
an input buffer;
a program code that accesses a plurality of bits of coded bitstream data bit-by-bit in a sequence from the input buffer;
a program code that individually tests the bits in the sequence for up to a preselected number N bits of the accessed plurality of bitstream bits;
a program code that determines whether the individually tested bits in the sequence correspond to a valid VLC code;
a program code that sets a decoded value from a short length VLC code that is hard-coded in processor instructions and selected based on results of the individual bit tests when the sequence corresponds to a valid VLC code; and
a program code that accesses the lookup table and sets a decoded value by forming an address pointer from a plurality of bits of the coded bitstream data and applying the address pointer to select a table element of the lookup table.

15. An apparatus according to claim 13 wherein the program code that individually tests the bits in the sequence and the program code that determines whether the bits in the sequence correspond to a valid VLC code comprise:
a program code that individually tests a minimum number of bits M sequentially in the sequence; and
a program code that determines whether the M bits specify a valid VLC code; wherein
the number of bits in the multiple-bit bit testers and multiple-bit comparators increases from the minimum number of M bits to a maximum of N bits.

16. An apparatus according to claim 14 wherein:
the VLC code is a discrete cosine transform (DCT) code;
the preselected number of bits N is 5 bits; and
the address pointer is a 16 bit address pointer.

17. An apparatus according to claim 13 further comprising:
program code responsive to the program code that individually tests the bits in a sequence and the program code that determines whether the sequence of bits is a valid VLC code that adaptively selects the number N as a function of frequency of occurrence of VLC codes according to VLC code length.

18. An apparatus according to claim 17 further comprising:
a program code responsive to the program code that determines whether the N bits include a valid VLC code that accumulates a histogram by counting the number of occurrences of codes at a plurality of VLC code lengths; and
a program code responsive to the program code that accumulates a histogram that examines the histogram to determine the number of bits $N_b$ for which a selected percentage of the codes have fewer bits than $N_b$.

19. An apparatus according to claim 18 wherein the selected percentage of codes is a percentage in the range from 60% to 80%.

20. An apparatus according to claim 13, further comprising:
a program code responsive to the program code that individually tests the bits in a sequence and responsive to the program code that determines whether the sequence of bits is a valid VLC code, the program code adaptively selecting the number N as a function of a bit code parsing time and frequency of occurrence of VLC codes having a plurality of lengths.

21. An apparatus according to claim 20 further comprising:
a program code that generates an array designating parsing time for a parsing a plurality of VLC codes according to VLC code length;
a program code responsive to determination of a valid VLC code that accumulates a histogram of frequency of occurrence of VLC codes according to VLC code length;
a program code responsive to accumulation of a histogram that convolves the parsing time array and the histogram; and
program code responsive to the convolution that selects the number of bits N in accordance with the result of the convolution operation.

22. An apparatus for decompressing video information comprising:
an input buffer;
a variable length coding (VLC) decoder coupled to the input buffer;
an inverse zig-zag and quantizer circuit coupled to the VLC decoder;
an inverse discrete cosine transform (DCT) circuit coupled to the inverse zig-zag and quantizer circuit;
a motion decoding circuit;
an adder coupled to the IDCT circuit and to the motion decoding circuit; and
a display device, wherein the VLC decoder includes:
a memory including a lookup table having a plurality of table elements;
an input buffer coupled to the memory;
a program code that accesses a plurality of bits of coded bitstream data bit-by-bit in a sequence from the input buffer;
a program code that individually tests the bits in the sequence for up to a preselected number N bits of the plurality of accessed plurality of bitstream bits;
a program code that determines whether the individually tested bits in the sequence correspond to a valid VLC code;
a program code that sets a decoded value from a short length VLC code that is hard-coded in processor instructions and selected based on results of the individual bit tests when the sequence corresponds to a valid VLC code; and
a program code that accesses the lookup table and sets a decoded value by forming an address pointer from a plurality of bits of the coded bitstream data and applying the address pointer to select a table element of the lookup table.

* * * * *